United States Patent [19]

Brody

[11] 4,126,901
[45] Nov. 21, 1978

[54] PHOTOVOLTAIC-FERROELECTRIC CORRELATION DEVICES

[75] Inventor: Philip S. Brody, Brookmont, Md.

[73] Assignee: The United States of America as represented by the Secretary of the Army, Washington, D.C.

[21] Appl. No.: 893,568

[22] Filed: Apr. 5, 1978

Related U.S. Application Data

[63] Continuation-in-part of Ser. No. 824,894, Aug. 15, 1977, Pat. No. 4,051,465, which is a continuation-in-part of Ser. No. 533,365, Dec. 16, 1974, Pat. No. 3,855,004.

[51] Int. Cl.² .................... G11C 11/42; G11C 13/04
[52] U.S. Cl. .................................... 365/120; 365/106; 365/114; 357/30; 307/310; 307/238; 365/117
[58] Field of Search ............... 365/106, 109, 112, 114, 365/117, 120; 357/30; 307/310

[56] References Cited

U.S. PATENT DOCUMENTS

| 3,518,634 | 6/1970 | Ballman | 365/114 |
| 3,812,479 | 5/1974 | Witteles | 365/114 |
| 4,011,442 | 3/1977 | Engeler | 365/114 |

Primary Examiner—Terrell W. Fears
Attorney, Agent, or Firm—Nathan Edelberg; Robert P. Gibson; Saul Elbaum

[57] ABSTRACT

A photovoltaic-ferroelectric correlation device for both optical pattern correlation and signal correlation. A remanent polarization pattern is induced in a photovoltaic-ferroelectric layer, and when irradiated with an illumination pattern, the photocurrent produced at each point of the layer is proportional to the product of the remanent polarization at that point and the illumination at that point. The sum of the point currents produced, or the short circuit photocurrent of the device, is proportional to the integral of the products, which is the correlation of the two patterns.

12 Claims, 6 Drawing Figures

PHOTOVOLTAIC-FERROELECTRIC CORRELATION DEVICES

RIGHTS OF THE GOVERNMENT

The invention described herein may be manufactured, used, and licensed by or for the United States Government for governmental purposes without the payment to me of any royalty thereon.

The present application is a continuation-in-part of U.S. Patent Application No. 824,894, filed Aug. 15, 1977 incorporated herein by reference, which in turn is a continuation-in-part of U.S. Patent Application No. 533,365, filed Dec. 16, 1977 now U.S. Pat. No. 4,051,465 and U.S. Pat. No. 3,855,004, both of which are incorporated herein by reference.

The present invention is directed to correlation devices including both optical pattern correlation devices and electrical signal correlation devices.

As is known, optical pattern correlation devices have found extensive use in recent years, especially in the image identification and character recognition fields, and in positioning or alignment applications. Signal correlation devices, on the other hand, are used where it is necessary to separate a signal from a noisy environment such as in radar and satellite signal processing, and in spread spectrum communications, where the information to be detected is ordinarily beneath the level of noise.

One disadvantage of many prior art correlators has been their lack of a re-programming capability. That is, once the stored pattern which is to be correlated against is fixed in the device, it cannot be easily changed. Obviously, this is undesirable, for instance, in character recognition applications where it may be desirable to rapidly change the stored pattern until a match with the characters to be recognized is obtained, or in radar or guidance applications where it possibly might be desirable to re-program the target towards which a missile is directed.

Additionally, it is desirable to provide a correlation device which is capable of simultaneously storing multiple patterns and simultaneously computing the correlation function. This is especially useful in signal processing applications.

It is therefore an object of the invention to provide a correlation device which is capable of being rapidly re-programmed.

It is a further object of the invention to provide a correlation apparatus which can store multiple patterns.

It is a further object of the invention to provide a correlation device which permits parallel computation for all picture elements, thereby allowing computations to be performed in real time.

It is a further object of the invention to provide a correlation device in which the stored information is stored in a non-volatile fashion.

It is still a further object of the invention to provide a correlation device which is easily fabricated and which uses materials which are relatively inexpensive.

The above objects are accomplished by providing a device which utilizes a layer or layers of photovoltaic-ferroelectric material as the correlation medium. The pattern which is to be correlated against is stored in the material as a spatially varying remanent polarization pattern. When illuminated with a spatially varying illumination pattern, the resulting induced current at each point of the layer is proportional to the product of the remanent polarization at that point and the intensity of the incident illumination at that point and the sum of the currents at all points of the ferroelectric layer is the integral of this product, which is the correlation of the two patterns.

The invention will be better understood by referring to the accompanying drawings in which.

Figure 1:
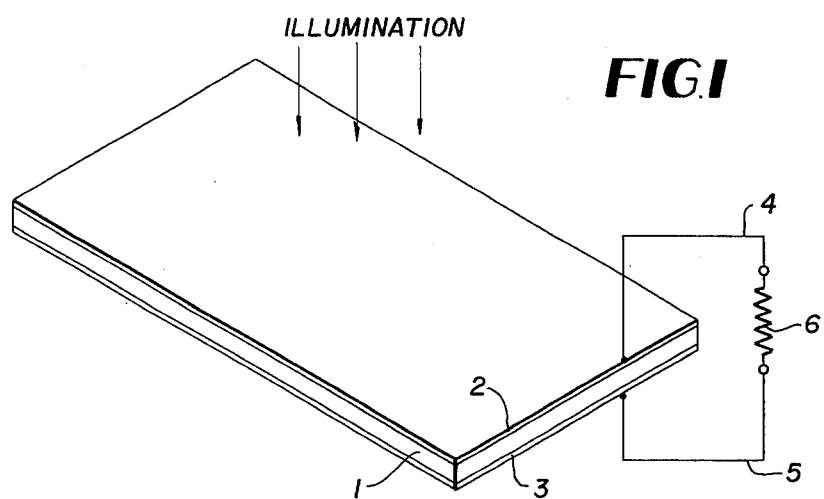
FIG. 1 is a pictorial representation of a layer of photovoltaic-ferroelectric material disposed between two electrodes, which is useful in explaining the principle of operation of the invention.

The principle of the invention is illustrated in conjunction with FIG. 1. In that Figure, layer 1 is a layer of photovoltaic-ferroelectric material which is disposed between transparent electrode 2 and electrode 3. Photovoltaic-ferroelectric materials are certain ferroelectric materials, which after having been remanently polarized by the application of a poling voltage, produce a photovoltage upon being illuminated. The properties of such materials, as well as examples of such materials, are discussed in U.S. Pat. No. 3,855,004 and in U.S. Pat. No. 4,051,465 which are incorporated herein by reference.

Referring to FIG. 1, the thickness of photovoltaic layer 1 is of the order of the absorption depth of the incident illumination. The illumination which enters through the transparent electrode generates photocarriers, which with zero voltage applied, produces a photocurrent which is proportional to the magnitude of any remanent polarization which is directed perpendicular to the plane of the electrodes.

If the distribution of the remanent polarization is uniform over the area covered by the electrodes, then the resulting photocurrent flowing through load impedance 6, for a spot of illumination at point $x, y$ on the electrode plane is independent of the position of the point. If the polarization, however, is not uniform, but is a function of position $P_\eta(x,y)$ then the photovoltaic current will also be a function of position, and for a spot of constant intensity at a point $x,y$, the current $i(x,y)$ is proportional to the remanent polarization $P_\eta(x,y)$; that is, $$i(x,y) = AP_\eta(x,y).$$

If the incident illumination I, is also a function of the spatial coordinates $I = I(x,y)$, then the output current is $$i(x,y) = A'P_\eta(x,y)I(x,y)$$

since the photocurrent is proportional to the intensity of the illumination as well as to the remanent polarization.

If a pattern illuminates the ferroelectric surface, then the output current $i_0$ in FIG. 1 is the sum of the current at all points of the surface; specifically, $$i_0 = A'' \int I(x,y)P_\eta(x,y)dxdy$$

If the incident optical pattern is shifted relative to the remnant polarization pattern, then the current output is a function of the shift parameters $\xi$ and $\eta$, and is $$i_0(\xi,\eta) = A'' \int I(x+\xi, y+\eta) P_\eta(x,y) dxdy$$

The above is the correlation function of the real functions $I(x,y)$ and $P_\eta(x,y)$, and the current output thus corresponds to the correlation function. If the two functions $I(x,y)$ and $P_\eta(x,y)$ are the same, then the function is the autocorrelation function, and if they are different, it is the cross-correlation function.

Figure 2:
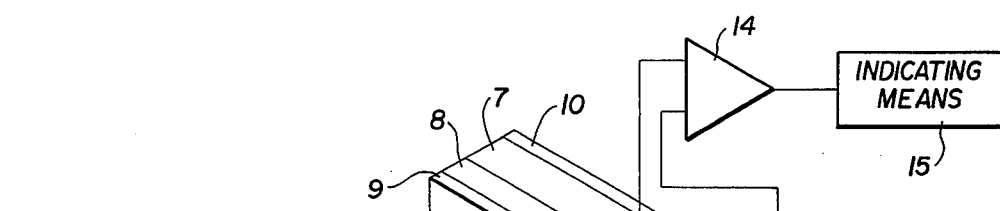
FIG. 2 is a pictorial representation of a first embodiment of the invention.

FIG. 2 is a pictorial representation of a first embodiment of the invention for computing the correlation function between two optical intensity patterns. This embodiment is useful in image identification applications including character recognition, and in alignment or positioning applications.

Referring to FIG. 2, the correlation device is comprised of a layer of photovoltaic-ferroelectric material 7 and a layer of photoconductive material 8, which are sandwiched between electrodes 9 and 10, electrode 9 being transparent. For applying a voltage pulse across the electrodes, voltage pulse source V is provided, and it is connected to the electrodes through switch 13. The electrodes are connected to low input impedance current amplifier 14 to amplify the output current, and amplifier 14 is connected to electrical indicating means 15, which provides an output indication of the correlation function. The output impedance of the pulse source is maintained greater than the input impedance of the amplifier, otherwise provision may be made for removing the shunting impedance of the voltage source if necessary.

Additionally, for projecting optical intensity patterns on the correlation device, light source 20, transparency 21 and projection lens 22 are provided. The transparency may be any known medium which provides areas of varying transparency and opacity, such as for instance, celluloid film. For providing the relative shift between the pattern and the device, the device may be mechanically moved, or optical deflector 25 may be provided which may be any known deflecting device, such as for instance, those which deflect an optical pattern in accordance with an applied electrical signal. It is to be understood that the optics form no part of the present invention, and that any optical system which is operative to project a pattern on the correlation device and to shift it across the device may be used.

The correlation device computes the cross correlation function of two light intensity patterns which are denoted as $I_1(x,y)$ and $I_2(x,y)$. The correlation function itself is denoted as $\phi_{12}(\xi,\eta)$ where $\xi$ and $\eta$ are the shift parameters for $x$ and $y$ respectively.

The procedure is to first illuminate the device with one of the patterns, which is here selected to be $I_1(x,y)$. The illumination is at a wavelength which penetrates the full thickness of the photoconductive layer and is of sufficient intensity to cause a substantial increase in the conductivity of the photoconductive material in the regions illuminated. The photovoltaic-ferroelectric material while also generally photoconductive, is a much poorer photoconductor than the photoconductive material so that when a poling voltage pulse from voltage source V is applied across the electrodes, the surface of the photovoltaic-ferroelectric material in the region behind the illuminated portions of the photoconductive layer becomes charged. The coercive field for inducing remnant polarization is exceeded in these regions of the photovoltaic-ferroelectric material, and remnant polarization is induced in proportion to the current which flows through the illuminated portions of the photoconductive layer during the times that the voltage pulse is applied, which is proportional to the intensity of the illumination. Hence, for an illumination pattern $I_1(x,y)$ at a point $x,y$:

$$P_\eta(x,y) = \beta I_1(x,y).$$

Once the polarization pattern $P_\eta(x,y)$ has been induced, the device is irradiated with illumination which is of a wavelength which penetrates the thickness of the photoconductive layer and which more or less uniformly illuminates the thickness of the photovoltaic-ferroelectric material where that material is selected to be of a thickness approximately equal to or less than the absorption length of the illumination wavelength in the ferroelectric material. The photovoltaic-ferroelectric effect causes a photovoltage to be produced, and the short circuit photocurrent flowing through the low impedance of the illuminated photoconductive layer and through the shunting impedance of the input of amplifier 14 is $$i_0 = \gamma \int I(x,y) P_\eta(x,y) dxdy$$

where I is the incident illumination and $\gamma$ the constant relating input intensity with output current.

The illumination of the detector with pattern $I_2(x,y)$, shifted by shift parameters $\xi,\eta$ when the remnant polarization pattern $I_1$ has been entered into the detector by the process described, results in a current $i_0(\xi,\eta) = \int \gamma \beta I_2(x+\xi, y+\eta) I_1(x,y) dxdy$ which is proportional to the cross correlation function between the patterns $I_1$ and $I_2$.

If we now define the constants $$d_1 = \gamma \beta \int I_1^2(x,y) dxdy$$

$$d_2 = \gamma \beta \int I_2^2(x,y) dxdy$$

the current $i_0(\xi,\eta)$ can be used to compute the normalized cross-correlation function $$\phi_{12}(\xi,\eta) = \gamma \beta (d_1 d_2)^{-\frac{1}{2}} \int I_2(x+\xi, y+\eta) I_1(x,y) dxdy$$

which, as known, is always less than 1 unless $I_1 = I_2$. The constants $d_1$ and $d_2$ can be determined sequentially, and the results digitized and stored for later use by utilizing ordinary digital hardware.

Figure 3:
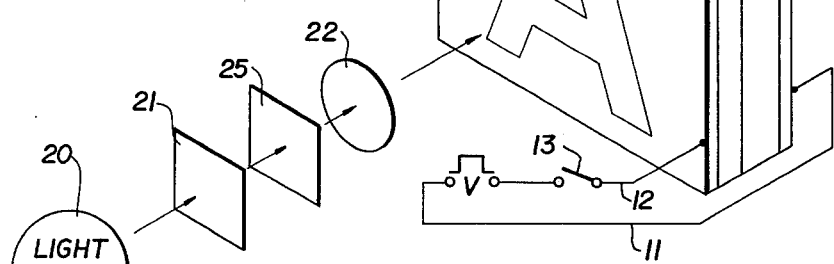
FIGS. 3 and 4 are pictorial representations of a second embodiment of the invention.
Figure 3:
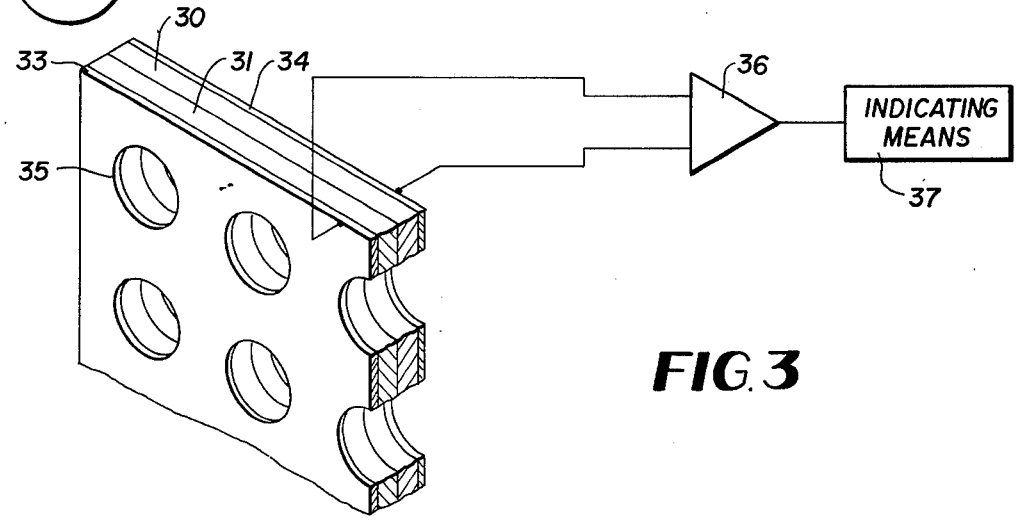
Figure 4:
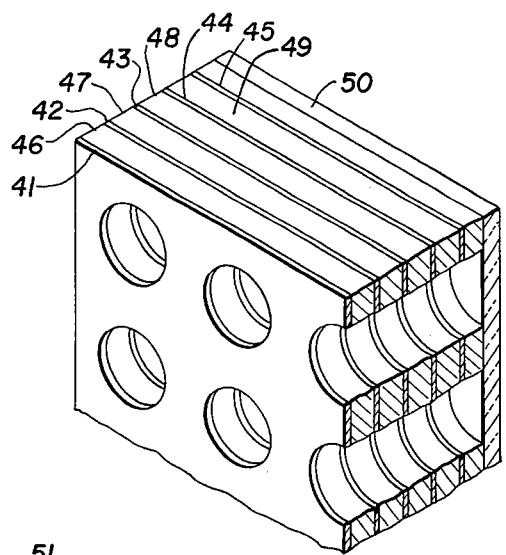

FIGS. 3 and 4 show a further embodiment of the invention in which the detector planes are multiply stacked within a three dimensional volume by making the photosensitive regions the interior surfaces of cylindrical cavities within the correlation device. Thus the correlation devices are stacked one behind the other to increase storage capacity, with any given device being capable of being accessed.

FIG. 3 shows a single device comprised of photovoltaic-ferroelectric layer 30 and photoconductive layer 31, sandwiched between electrodes 33 and 34. In this embodiment, both electrodes are opaque, but the sandwich has an array of cavities 35 therethrough. Incoming illumination is incident on the cavities, and thereby irradiates the photoconductive and photovoltaic-ferroelectric layers.

A plurality of devices as shown in FIG. 3 can be stacked so as to comprise the composite apparatus illustrated in FIG. 4. At the rear of the plurality of stacked devices is a reflector 50 which causes the cavities of the respective devices to be irradiated more or less uniformly. For the purpose of storing a remanent polarization pattern in a selected plane, any of the devices 46–49 can be accessed by applying a poling voltage across the appropriate pair of electrodes (of electrodes 41–45) while the cavities of the composite apparatus are illuminated. Similarly, the short circuit output current can be obtained by illuminating the cavities while connecting the appropriate pair of electrodes to a current amplifier.

It should be clear that in the embodiment of FIG. 4, storage of the remanent polarization pattern as well as production of the output current which corresponds to the correlation function is obtained in the same way as described in conjunction with the embodiment of FIG. 2, except that the illumination both for inducing remanent polarization and for producing the output current is by a pattern of light which irradiates the cavities. This light results from a mosaic breakup of the incident continuous intensity pattern.

The embodiment described illustrates one embodiment in which the correlation of an optical pattern and a number of stored patterns are obtained simultaneously. In general, any incident pattern can be optically divided into a multiplicity of patterns by such devices as fly eye lenses or partially reflecting mirrors. It can then be arranged for these identical patterns to simultaneously illuminate a plurality of recording detecting devices each with a different stored pattern or groups of stored patterns where such recording detecting devices are those shown in conjunction with FIGS. 2, 3, and 4.

Figure 5:
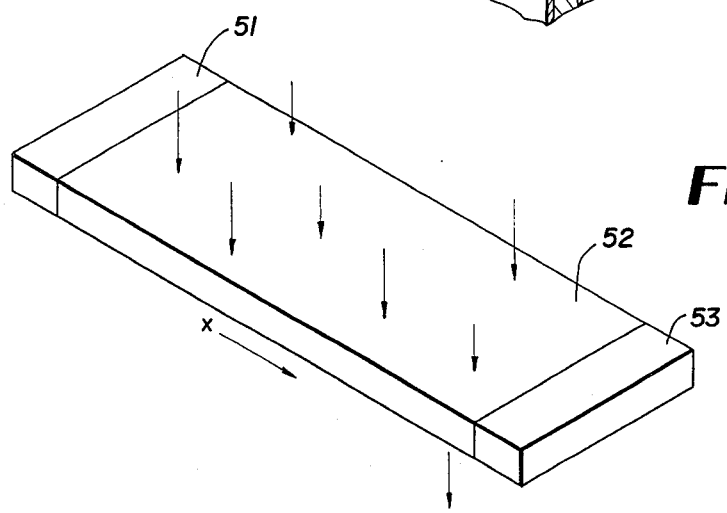
FIG. 5 is a pictorial representation of an acousto-optical device for converting a time varying electrical signal into a spatially varying optical pattern.

As mentioned above, the correlation devices of the present invention can be used for signal correlation as well as optical pattern correlation. For this type of system, however, it is necessary to additionally provide a device for converting a time varying electrical input signal to a corresponding spatially varying optical pattern. Such a device is shown in FIG. 5, and is comprised of acousto-optic material transducer 52, input piezoelectric transducer 51, and acoustic absorber 53. An electrical signal applied to piezoelectric transducer 51 causes a corresponding acoustic signal to be propagated across acousto-optic material 52. This acoustic signal manifests itself as a propagating index of refraction pattern in the acousto-optic material. At the same time, the acoustic-optic material is irradiated by uniform illumination, which illumination is modulated by the moving index of refraction pattern. The result is a spatially varying illumination pattern existing from the side of the acoustic-optic material opposite the input illumination, which pattern corresponds to the electrical signal.

Either the embodiment shown in FIG. 2 or the embodiment shown in FIG. 4 can be used for signal correlation. The stored remanent polarization pattern corresponds to the function $F_1(x)$. If the input electrical signal is $F_2(t)$, then at any point $x$ of the output of the acousto-optic device there is a pattern $F_2(t+x/v)$ where $v$ is the acoustic velocity of the pattern. When the correlation device which has $F_1(x)$ stored therein is irradiated with the $F_2$ pattern, the current output corresponds to the one dimensional correlation function:

$$\phi(t) = AB \int F_1(x) F_2(x+vt) dx$$

While FIG. 5 illustrates an acousto-optic transducer, it should be understood that any other transducer which converts a time varying electrical signal into a corresponding optical spatial pattern can be utilized. For instance it would be possible to use photographic film with the shifting being produced mechanically.

Figure 6:
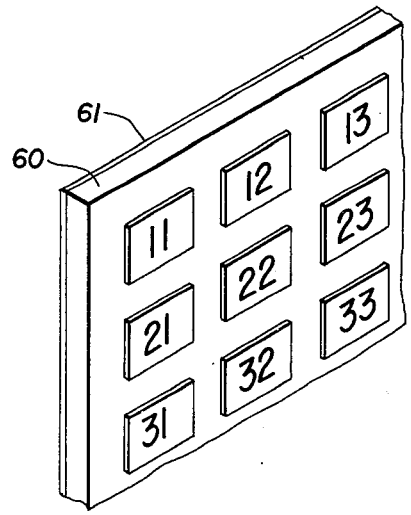
FIG. 6 is a pictorial representation for effecting direct electrical control of a layer of photovoltaic-ferroelectric material.

While the embodiments of FIG. 2 and FIG. 4 have been described in conjunction with the induction of the remanent polarization being by optical control in a photoconductor-photovoltaic-ferroelectric sandwich, it should be understood that the remanent polarization can also be induced in the photovoltaic-ferroelectric layer by other methods. For instance, FIG. 6 illustrates inducing the remanent polarization by direct electrical control utilizing a plane electrode on one side of the layer and a mosaic of electrodes as shown in the Figure, on the other side thereof. Selective application of voltages to the matrix of electrodes produces the remanent polarization pattern. Also, as known to those skilled in the art, Curie Point writing methods utilizing focussed laser beams can be utilized to produce the desired remanent polarization pattern.

I wish it to be understood that I do not desire to be limited to the exact details of construction shown and described, for obvious modifications can be made by a person skilled in the art.

What is claimed is:

1. A photovoltaic-ferroelectric correlation device comprising,
   a layer of photovoltaic-ferroelectric material,
   means for applying a spatially varying voltage pattern to said layer of material to induce a remanent polarization pattern therein which corresponds to said voltage pattern,
   means for illuminating said remanently polarized layer with an illumination pattern having spatial variations in intensity,
   means for collecting the photocurrent induced at each point on the surface of said photovoltaic-ferroelectric layer as a result of said illumination, which photocurrent is proportional to both the remanent polarization and the intensity of the incident illumination, and
   means for providing an indication of the total current induced, which indication corresponds to the correlation of said two patterns.

2. The correlation device of claim 1 further including means for spatially shifting said illumination pattern across said photovoltaic-ferroelectric layer.

3. The correlation device of claim 1 wherein said photovoltaic-ferroelectric layer and a photoconductive layer are sandwiched between two electrodes, at least one of which is transparent, said means for applying said voltage pattern including said photoconductive layer, and said means for applying said voltage pattern also including both voltage source means for applying a voltage across said electrodes and pattern storage illumination means for illuminating said transparent electrode and said photoconductive layer with an illumination pattern, whereby a voltage pattern corresponding to said illumination pattern is applied across said ferroelectric-photoconductive layer.

4. The correlation device of claim 3 wherein said means for providing an indication of said total current includes current amplifier means.

5. The correlation device of claim 1 wherein said means for applying a voltage pattern includes an array of electrodes disposed on at least one side of said ferroelectric layer and voltage source means for direct application to said array of electrodes.

6. The correlation device of claim 1 wherein said patterns to be correlated are mosaic patterns, said photovoltaic-ferroelectric material having an array of cavities therein, said means for applying a voltage pattern comprising means for applying a pattern of discrete voltages at said cavities, and said means for illuminating comprising means for applying an illumination pattern of descrete light beams which are made incident on said cavities.

7. A photovoltaic-ferroelectric correlation device for correlating patterns, comprising,
   a layer of photovoltaic-ferroelectric material and a layer of photoconductive material sandwiched between two electrodes, said sandwich having an array of cavities therein,
   means for inducing a remanent polarization pattern in said array of cavities comprising means for applying a voltage across said sandwich and first illumination means for illuminating said cavities with a first illumination pattern while said voltage is applied,
   second illumination means for illuminating said cavities after said voltage is removed with a second pattern to be correlated with said first pattern,
   means for collecting the photocurrent induced in each cavity which photocurrent is proportional to the product of said remanent polarization and the intensity of said second illumination, and
   means for providing an indication of the total current from all of said cavities, which is proportional to the correlation of said two patterns.

8. A photovoltaic-ferroelectric correlation apparatus for correlating patterns, comprising,
   a plurality of correlation devices which are stacked together, each such correlation device comprising a device as recited in claim 7.

9. The correlation device of claim 3 for signal correlation wherein said means for illuminating comprises means for converting a time varying signal to be correlated into a spatially varying illumination pattern.

10. The correlation device of claim 9 wherein said time varying signal to be correlated is an electrical signal.

11. The correlation device of claim 9 wherein said time varying signal to be correlated is an acoustic signal.

12. The correlation device of claim 9 wherein said means for converting said time varying signal to said spatially varying optical signal comprises acousto-optic means.

* * * * *